(12) United States Patent
Hwang et al.

(10) Patent No.: US 8,058,800 B2
(45) Date of Patent: Nov. 15, 2011

(54) ORGANIC LIGHT EMITTING DISPLAY INCLUDING AN OPTICAL PATH CONTROLLER

(75) Inventors: Young-In Hwang, Yongin-si (KR); Baek-Woon Lee, Yongin-si (KR); Hae-Yeon Lee, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 234 days.

(21) Appl. No.: 12/330,043

(22) Filed: Dec. 8, 2008

(65) Prior Publication Data

US 2010/0026178 A1     Feb. 4, 2010

(30) Foreign Application Priority Data

Aug. 4, 2008  (KR) .................. 10-2008-0076093

(51) Int. Cl.
*H05B 33/00* (2006.01)
*H05B 33/22* (2006.01)
*H01J 1/62* (2006.01)

(52) U.S. Cl. ........ 313/506; 313/504; 313/512; 428/690; 428/917; 445/24

(58) Field of Classification Search ........... 313/504–506
See application file for complete search history.

(56) References Cited

U.S. PATENT DOCUMENTS

| | | | | |
|---|---|---|---|---|
| 5,554,911 A * | 9/1996 | Nakayama et al. | ........... | 313/504 |
| 5,949,187 A * | 9/1999 | Xu et al. | ........... | 313/504 |
| 6,111,270 A * | 8/2000 | Xu et al. | ........... | 257/72 |
| 6,680,570 B2 * | 1/2004 | Roitman et al. | ........... | 313/506 |
| 7,030,553 B2 * | 4/2006 | Winters et al. | ........... | 313/504 |
| 2004/0217697 A1 * | 11/2004 | Lee et al. | ........... | 313/504 |
| 2005/0142976 A1 * | 6/2005 | Suzuki | ........... | 445/24 |
| 2007/0102737 A1 * | 5/2007 | Kashiwabara et al. | ........... | 257/291 |
| 2008/0203898 A1 * | 8/2008 | Kobayashi | ........... | 313/498 |
| 2008/0203908 A1 * | 8/2008 | Hasegawa et al. | ........... | 313/504 |

* cited by examiner

*Primary Examiner* — Sikha Roy
(74) *Attorney, Agent, or Firm* — H.C. Park & Associates, PLC

(57) ABSTRACT

An organic light emitting display according to an exemplary embodiment of the present invention includes a transistor arranged on an insulating substrate, a pixel electrode connected to the transistor and including a reflective film, an optical path controller arranged on the pixel electrode, an auxiliary electrode arranged on the pixel electrode and the optical path controller, an organic light emitting member arranged on the organic light emitting member, and a common electrode arranged on the organic light emitting member, wherein the optical path controller has a lower light absorption coefficient than the auxiliary electrode.

12 Claims, 9 Drawing Sheets

ORGANIC LIGHT EMITTING DISPLAY INCLUDING AN OPTICAL PATH CONTROLLER

CROSS REFERENCE TO RELATED APPLICATION

This application claims priority from and the benefit of Korean Patent Application No. 10-2008-0076093, filed on Aug. 4, 2008, which is hereby incorporated by reference for all purposes as if fully set forth herein.

BACKGROUND OF THE INVENTION

1. Field of the Invention

The present invention relates to an organic light emitting display and a fabricating method thereof.

2. Discussion of the Background

An organic light emitting display ("OLED") includes a plurality of pixels. Each pixel includes an organic light emitting element and a thin film transistor ("TFT") to drive it.

The organic light emitting element includes an anode, a cathode, and an organic light emitting member therebetween.

The organic light emitting member represents at least one color of white, red, green, or blue. Light emits outwardly from the organic light emitting member through a transparent electrode. However, total reflection or light interference is generated between thin films of the OLED, thereby deteriorating optical characteristics such as luminance and color reproducibility.

SUMMARY OF THE INVENTION

The present invention provides an organic light emitting display that can increase optical characteristics by employing a micro-cavity. The present invention also provides a method of fabricating a flat panel display that may improve optical efficiency.

Additional features of the invention will be set forth in the description which follows, and in part will be apparent from the description, or may be learned by practice of the invention.

The present invention discloses an organic light emitting display including an insulating substrate having a first area, a second area, and a third area, a plurality of transistors arranged on the insulating substrate, an insulating layer arranged on the transistors, a first pixel electrode, a second pixel electrode, and a third pixel electrode arranged on the insulating layer in the area corresponding to the first area, the second area, and the third area respectively and connected to the transistors, an optical path controller arranged on the first pixel electrode, a plurality of auxiliary electrodes arranged on the first pixel electrode, the second pixel electrode, the third pixel electrode and the optical path controller, a partition wall having a plurality of openings to expose a portion of the auxiliary electrodes, an organic light emitting member arranged on the auxiliary electrodes, and a common electrode arranged on the organic light emitting member.

The present invention further discloses an organic light emitting display including a transistor arranged on an insulating substrate, a pixel electrode connected to the transistor and including a reflective film, an optical path controller arranged on the pixel electrode, an auxiliary electrode arranged on the pixel electrode and the optical path controller, an organic light emitting member arranged on the auxiliary electrode, and a common electrode arranged on the organic light emitting member.

The present invention also discloses a method of manufacturing an organic light emitting display including forming a transistor on an insulating substrate, forming an insulating layer on the transistor, forming a first conductive film and a second conductive film on the insulating layer, forming an inorganic layer on the second conductive film, patterning the inorganic layer to form an optical path controller, forming a third conductive film on the second conductive film and the optical path controller, patterning the first conductive film, the second conductive film and the third conductive film to form a pixel electrode and an auxiliary electrode, and forming an organic light emitting member on the auxiliary electrode.

The present invention also discloses a method of manufacturing an organic light emitting display including forming a plurality of transistors on an insulating substrate including a first area, a second area, and a third area, forming an insulating layer on the transistors, forming a first conductive film, a second conductive film, and a third conductive film on the insulating layer, forming an inorganic layer on the third conductive film, patterning the inorganic layer to form an optical path controller in the first area, forming a fourth conductive film on the optical path controller and the third conductive film, patterning the first conductive film, the second conductive film, the third conductive film, and the fourth conductive film to form a pixel electrode and an auxiliary electrode in each of the first area, the second area, and the third area, and forming an organic light emitting member on the auxiliary electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
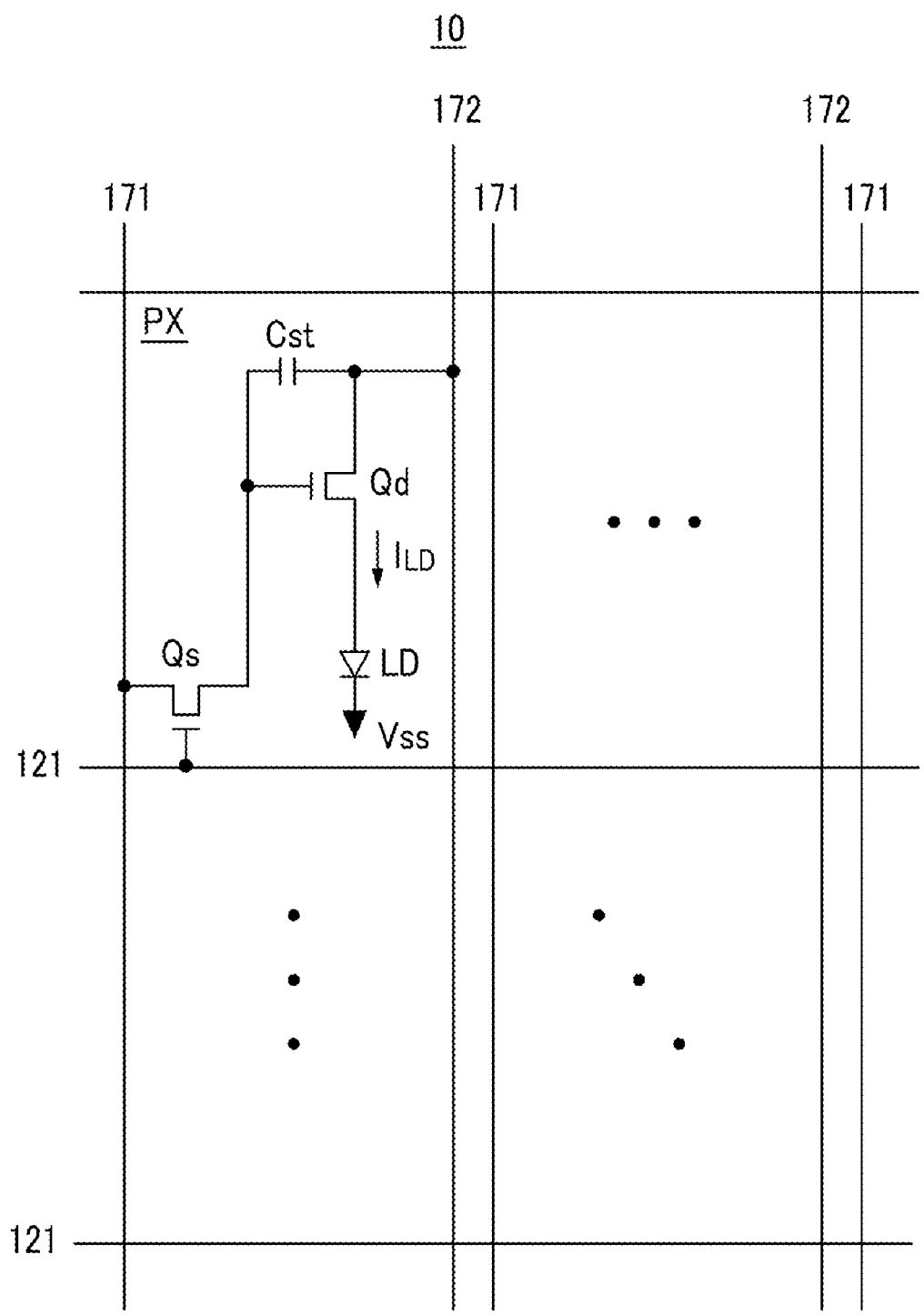
FIG. 1 is an equivalent circuit diagram of an organic light emitting display according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is an equivalent circuit diagram of an organic light emitting display according to an exemplary embodiment of the present invention. Referring to FIG. 1, an OLED 10 according to an exemplary embodiment of the present invention includes a plurality of signal lines 121, 171, and 172, and a plurality of pixels PX arranged in a matrix. The pixels are defined by the signal lines 121, 171, and 172.

The signal lines include gate lines 121, data lines 171, and driving voltage lines 172. Each gate line 121 transmits a gate signal (i.e. scan signal). Each data line 171 transmits a data signal, and each driving voltage line 172 transmits a driving voltage. The gate lines 121 extend in a row direction and are parallel to each other. The data lines 171 and the driving voltage lines 172 extend in a column direction and are parallel to each other.

Each pixel PX has a switching transistor Qs, a driving transistor Qd, a storage capacitor Cst, and an organic light emitting element LD.

The switching transistor Qs includes a control terminal, an input terminal and an output terminal. The control terminal is connected to the gate line 121 and the input terminal is connected to the data line 171. The output terminal is connected to the driving transistor Qd. The switching transistor Qs transmits the data signal received from the data line 171 to the driving transistor Qd in response to the gate signal received from the gate line 121.

The driving transistor Qd includes a control terminal, an input terminal and an output terminal. The control terminal is connected to the switching transistor Qs, and the input terminal is connected to the driving voltage line 172. The output terminal is connected to the organic light emitting element LD. The output current $I_{LD}$ of the driving transistor Qd is a function of a voltage difference between the control terminal and the output terminal.

The storage capacitor Cst is connected between the control terminal and the input terminal of the driving transistor Qd. The storage capacitor Cst stores the data signal applied to the control terminal of the driving transistor Qd and maintains it after the switching transistor Qs turns off.

The organic light emitting element LD includes a pixel electrode connected to the output terminal of the driving transistor Qd and a common electrode connected to a common voltage Vss. The organic light emitting element LD displays an image depending on the output current $I_{LD}$ of the driving transistor Qd.

The switching transistor Qs and the driving transistor Qd may be n type transistors. However, at least one of the switching transistor Qs or the driving transistor Qd may be a p type transistor. Also, the connection between the transistors Qs and Qd, the storage capacitor Cst and the organic light emitting element LD may be changed. Other transistors may be further included in the pixel PX to compensate a threshold voltage of the driving transistor or the organic light emitting element LD.

Figure 2:
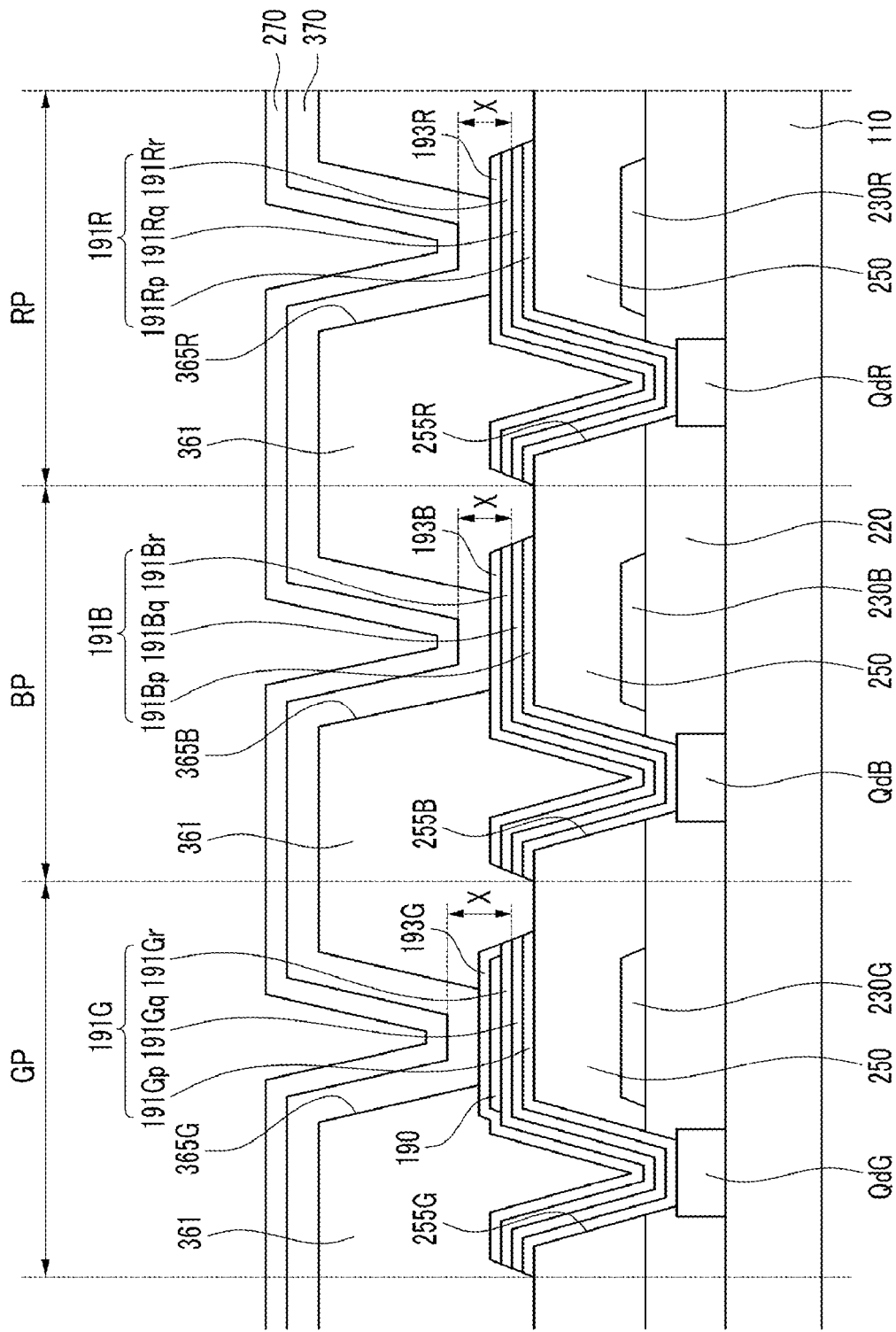
FIG. 2 is a sectional view of an organic light emitting display according to an exemplary embodiment of the present invention.

FIG. 2 is a sectional view of an organic light emitting display according to an exemplary embodiment of the present invention, such as the organic light emitting display of FIG. 1.

The organic light emitting display according to an exemplary embodiment of the present invention includes a red pixel RP, a green pixel GP, and a blue pixel BP. A white pixel WP may be further included. Colors other than red, green, and blue may be included as a primary color.

In FIG. 2, the associated items corresponding to the red pixel RP, the green pixel GP, and the blue pixel BP have "R", "G", or "B" after the reference symbols.

Referring to FIG. 2, a plurality of driving transistors QdR, QdG, and QdB are formed on an insulating substrate 110. The insulating substrate 110 may include glass, quartz, ceramic, or plastic.

A thin film structure 220 including a plurality of switching transistors such as the switching transistor Qs of FIG. 1 may be formed on the insulating substrate 110. The thin film structure 220 may include an insulating layer covering or a thin film layer under the driving transistors QdR, QdG, and QdB.

A red color filter 230R, a green color filter 230G and a blue color filter 230B are formed on the thin film structure 220. A planarizing layer 250 is formed on the color filters 230R, 230G and 230B and the thin film structure 220. The planarizing layer 250 may be formed of an organic material and have a flat surface. The planarizing layer 250 and the thin film structure 220 include a plurality of through-holes 255R, 255G and 255B to expose either a source or drain electrode of the driving transistors QdR, QdG and QdB, respectively.

A plurality of pixel electrodes 191R, 191G and 191B are formed on the planarizing layer 250. Each pixel electrode 191R, 191G and 191B includes a lower film 191 Rp, 191Gp and 191Bp, an intermediate film 191Rq, 191Gq and 191Bq and an upper film 191Rr, 191Gr and 191Br, respectively. Each pixel electrode 191R, 191G and 191B is connected to the associated driving transistor QdR, QdG and QdB through the through-hole 255R, 255G and 255B, respectively.

The lower film 191 Rp, 191Gp and 191Bp may include amorphous indium tin oxide ("a-ITO"), poly crystalline indium tin oxide ("p-ITO"), amorphous indium zinc oxide ("a-IZO"), or poly crystalline indium zinc oxide ("p-IZO"). The lower film 191 Rp, 191Gp and 191Bp has a thickness of about 50 Å to about 150 Å. The lower films 191 Rp, 191Gp and 191Bp may enhance adhesion between the planarizing layer 250 and the intermediate films 191Rq, 191Gq and 191Bq. The lower films 191 Rp, 191Gp and 191Bp are optional.

The intermediate films 191Rq, 191Gq and 191Bq may include a reflective metal such as silver (Ag), magnesium-silver alloy (Mg:Ag), aluminum (Al), or aluminum alloy. If the intermediate films 191Rq, 191Gq and 191Bq have a thickness of about 125 Å to 250 Å, the intermediate films 191Rq, 191Gq and 191Bq may be transflective to reflect and transmit partially incident light.

The upper films 191Rr, 191Gr and 191Br may include a transparent conductive layer such as a-ITO, p-ITO, a-IZO, or p-IZO. The upper films 191Rr, 191Gr and 191Br may have a thickness of about 25 Å to about 400 Å.

An optical path controller 190 is formed on the upper film 191Gr in the green pixel GP. The optical path controller 190 may include inorganic material such as silicon oxide (SiOx) or silicon nitride (SiNx), and have a thickness of about 750 Å to 1000 Å.

Auxiliary electrodes 193R, 193G and 193B are formed on the pixel electrodes 191R, 191G and 191B, respectively, and the optical path controller 190. The auxiliary electrodes 193R, 193G and 193B are formed of metal oxide such as a-ITO, p-ITO, a-IZO or p-IZO. The auxiliary electrodes 193R, 193G and 193B may have a thickness of about 25 Å to 300 Å. The auxiliary electrode 193G in green pixel GP is connected to the upper film 191Gr and covers the side of the optical path controller 190.

The lower films 191Rp, 191Gp and 191Bp, the intermediate films 191Rq, 191Gq and 191Bq, the upper films 191Rr, 191Gr, and 191Br, and the auxiliary electrodes 193R, 193G and 193B have substantially the same shape. Thus, the sides thereof are exposed.

A partition wall 361 is formed on the auxiliary electrodes 193R, 193G and 193B, and the planarizing layer 250. The partition wall 361 has a plurality of openings 365R, 365G and 365B to expose the auxiliary electrodes 193R, 193G and 193B. The optical path controller 190 is disposed in the area corresponding to the opening 365G in the green pixel GP.

A white organic light emitting member 370 is formed on the auxiliary electrodes 193R, 193G and 193B and the partition wall 361.

A common electrode 270 is formed on the white organic light emitting member 370 and transmits a common voltage Vss.

The white organic light emitting member 370 may have a multi-layered structure including a plurality of organic material, different kinds of which represent different colors, which may include a primary color such as red, green, or blue. The common electrode 270 may include a reflective metal such as calcium (Ca), barium (Ba), magnesium (Mg), aluminum (Al), or silver (Ag).

A pixel electrode 191R, 191G and 191B, the white organic light emitting member 370, and the common electrode 270 form the organic light emitting element LD of FIG. 1. The pixel electrode 191R, 191G and 191B may be an anode, and the common electrode 270 may be a cathode.

The organic light emitting display according to an exemplary embodiment of the present invention displays images by radiating light through the insulating substrate 110. The light radiated from the white light emitting member 370 toward the insulating substrate 110 is transmitted toward the auxiliary electrodes 193R, 193G and 193B, the optical path controller 190 in the green pixel GP, and the upper films 191Rr, 191Gr and 191Br, to reach the intermediate films 191Rq, 191Gq and 191Bq. The intermediate films 191Rq, 191Gq and 191Bq reflect light toward the common electrode 270, and the common electrode 270 reflects the light again toward the intermediate films 191Rq, 191Gq and 191Bq. That is, the light is repeatedly reflected between the intermediate films 191Rq, 191Gq and 191Bq and the common electrode 270 such that a strong interference effect is generated in the light. Accordingly, light of a specific wavelength is constructive, and light of remaining wavelengths is destructive. Constructively interfered light emits outwardly through the lower films 191Rp, 191Gp and 191Bp and the color filters 230R, 230G and 230B.

A distance between the intermediate films 191Rq, 191Gq and 191Bq and the common electrode 270 is an optical path length (x). Optical characteristic, such as wavelength and color reproducibility of light radiated from each pixel depends on the optical path length (x) and refractivity of thin films in the optical path.

Thus, the optical path length (x) can be controlled, thereby generating light of desired wavelength and color reproducibility. The optical path lengths of the red pixel RP and the blue pixel BP may be identical, but the optical path length of the green pixel GP may be different for desired optical characteristics.

As shown in FIG. 2, the optical path controller 190 is formed on the upper film 191Gr of the green pixel GP, thereby creating a longer optical path length than the optical path length of the red pixel RP and the blue pixel BP. In one embodiment, the optical path controller 190 may have a lower light absorption coefficient than the upper films 191Rr, 191Gr and 191Br or the auxiliary electrodes 193R, 193G and 193B, thereby increasing reflectivity of the intermediate films 191Rq, 191Gq and 191Bq. If the upper films 191Rr, 191Gr and 191Br or the auxiliary electrodes 193R, 193G and 193B are formed of ITO or IZO, the optical path controller 190 may be formed of inorganic material such as silicon oxide or silicon nitride.

In one embodiment of the present invention, the optical path controller may be formed on the upper films 191Rr and 191Br of the red pixel RP and the blue pixel BP. As a result, the organic light emitting display can have desired optical characteristics.

FIG. 3, FIG. 4, FIG. 5, FIG. 6, and FIG. 7 illustrate a method of manufacturing the organic light emitting display of FIG. 2 according to an exemplary embodiment of the present invention.

Figure 3:
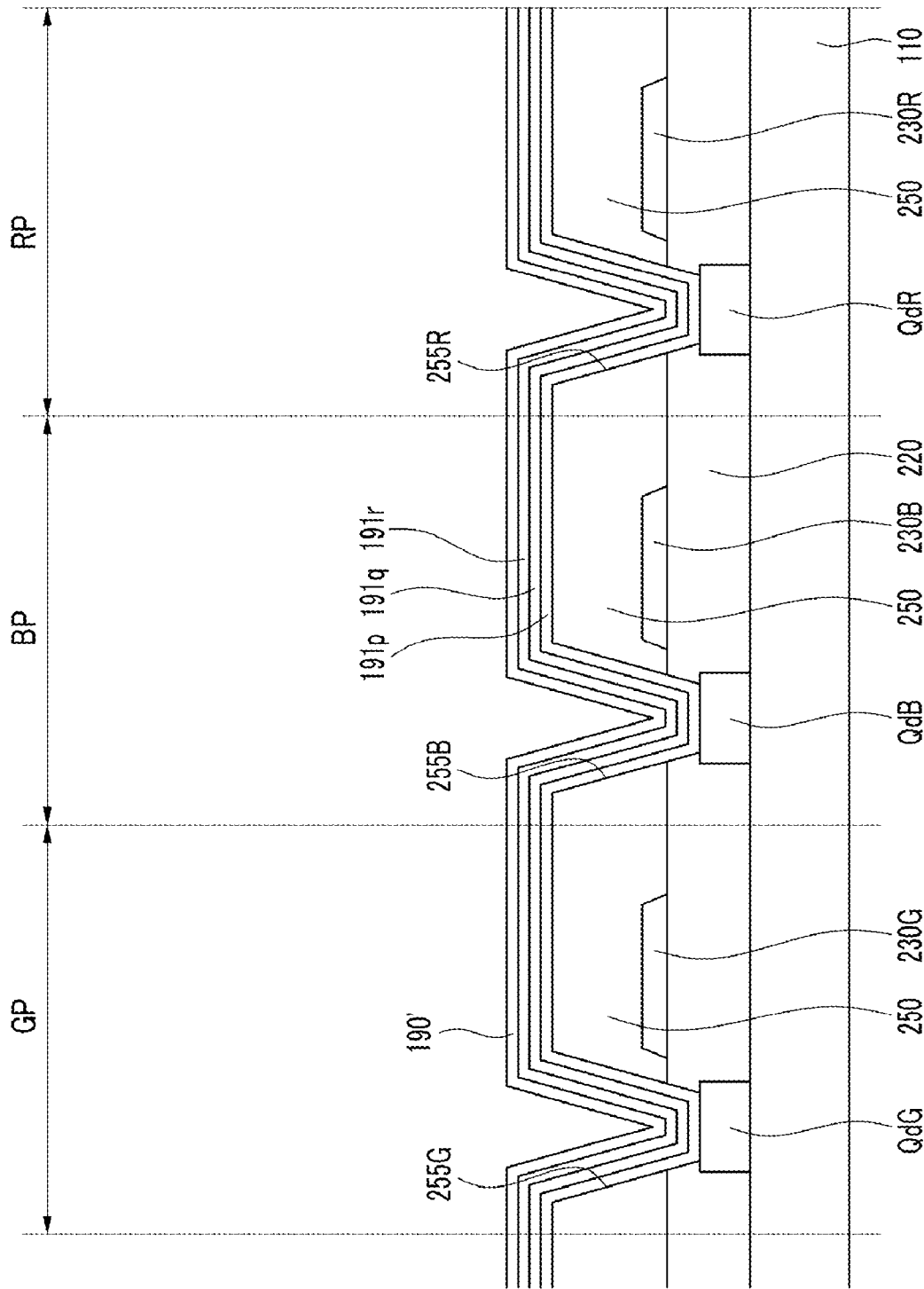
FIG. 3, FIG. 4, FIG. 5, FIG. 6, and FIG. 7 illustrate a method of manufacturing an organic light emitting display according to an exemplary embodiment of the present invention.

Referring to FIG. 3, a plurality of driving transistors QdR, QdG and QdB, a thin film structure 220 and a plurality of color filters 230R, 230G and 230B are formed on an insulating substrate 110. A planarizing layer 250 is formed on the driving transistors QdR, QdG and QdB, the thin film structure 220 and the color filters 230R, 230G and 230B. The planarizing layer 250 and the thin film structure 220 are patterned to form a plurality of through-holes 255R, 255G and 255B to expose a portion of the driving transistors QdR, QdG and QdB.

An a-IZO film 191p is formed on the planarizing layer 250, the thin film structure 220 and the exposed driving transistors QdR, QdG and QdB. A silver film 191q, a-IZO film 191r and silicon nitride film 190' are sequentially formed on the a-IZO film 191p.

Figure 4:
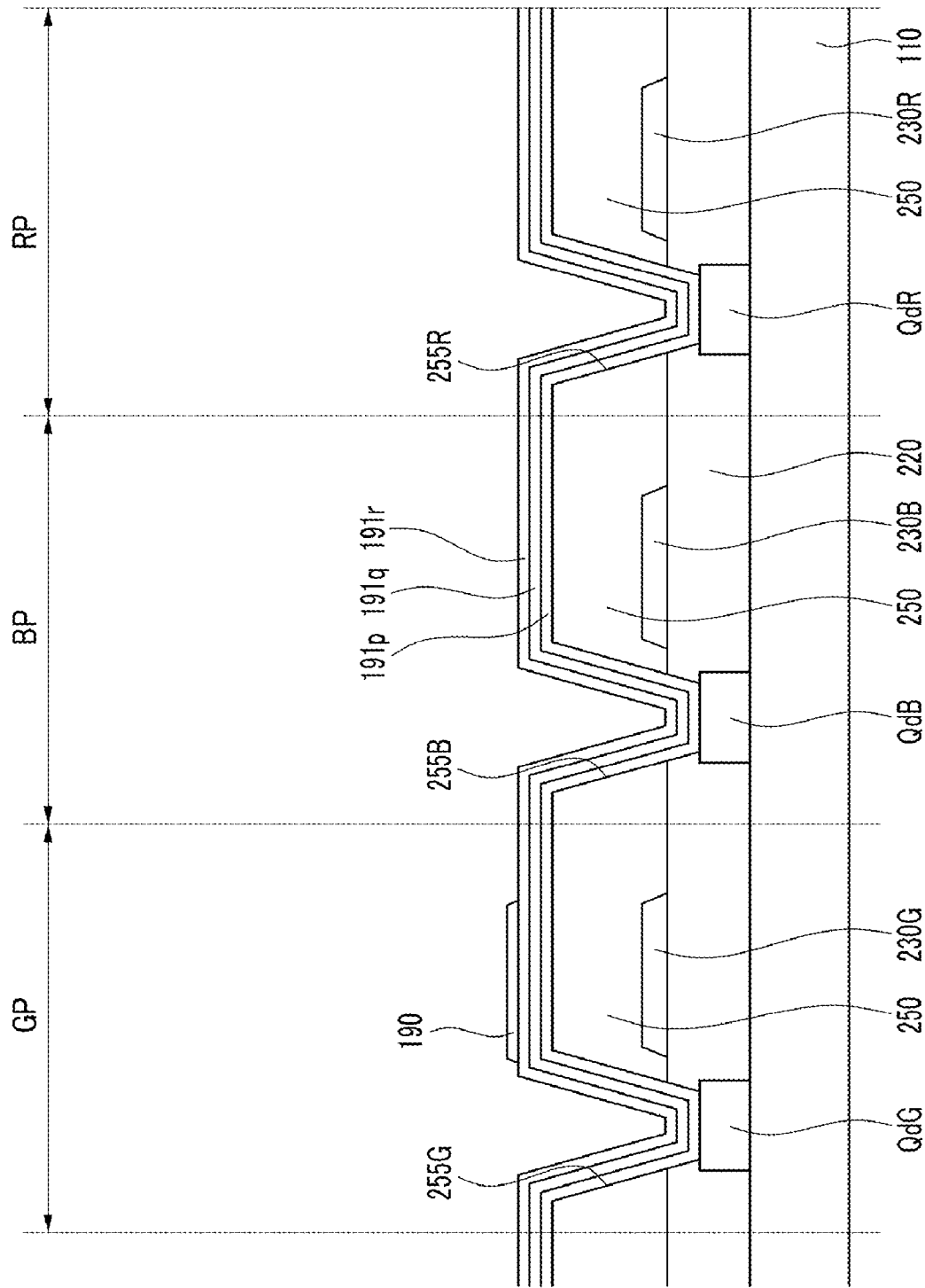

Referring to FIG. 4, the silicon nitride film 190' is patterned to form an optical path controller 190 in a green pixel GP.

Figure 5:
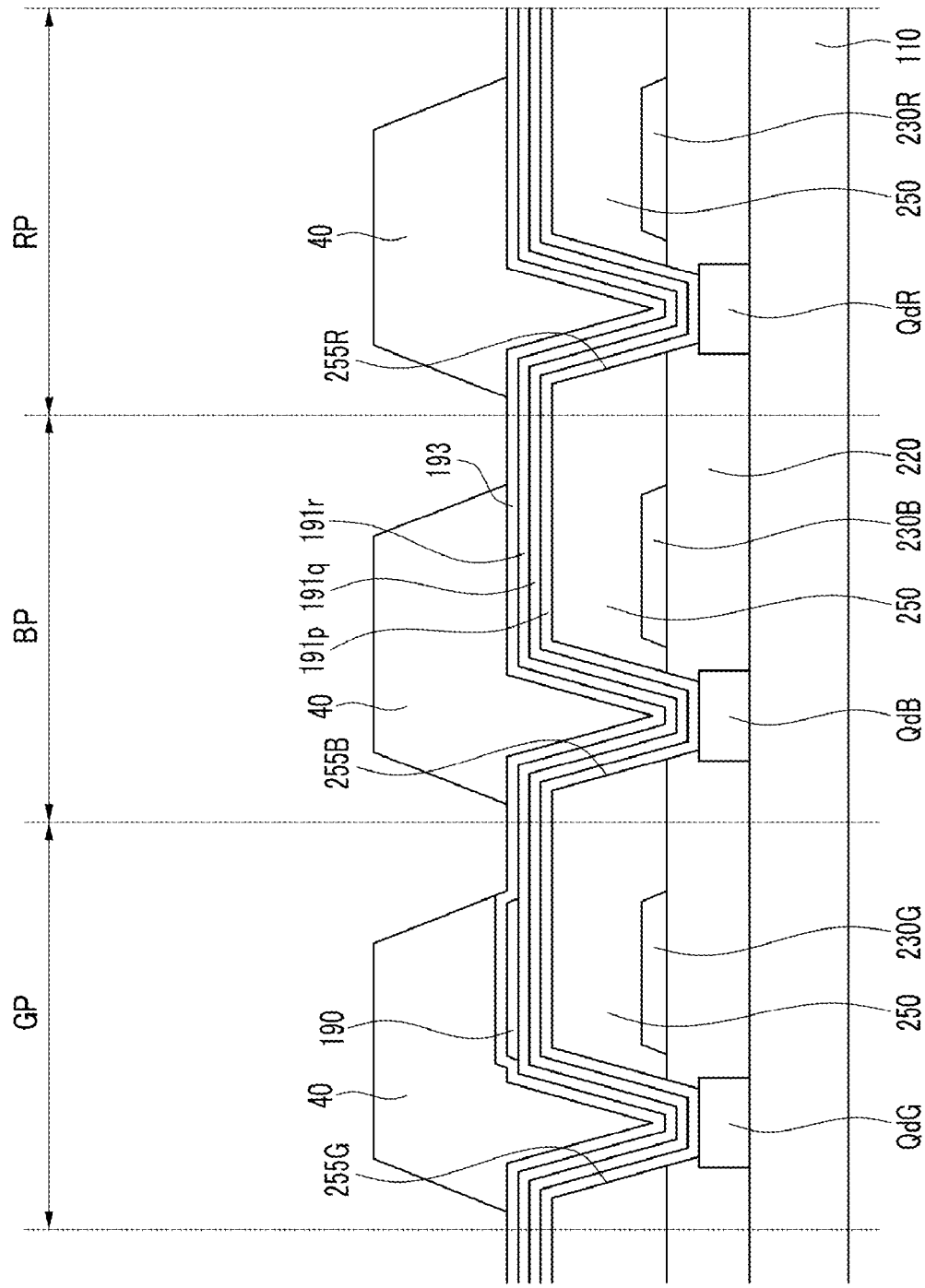

Referring to FIG. 5, an a-IZO film 193 is formed on the patterned optical path controller 190 and the a-IZO film 191r. A photo-sensitive layer 40 is formed on the a-IZO film 193. Before the photo-sensitive layer 40 is formed, the a-IZO films 191p, 191r and 193 may be annealed to crystallize.

Figure 6:
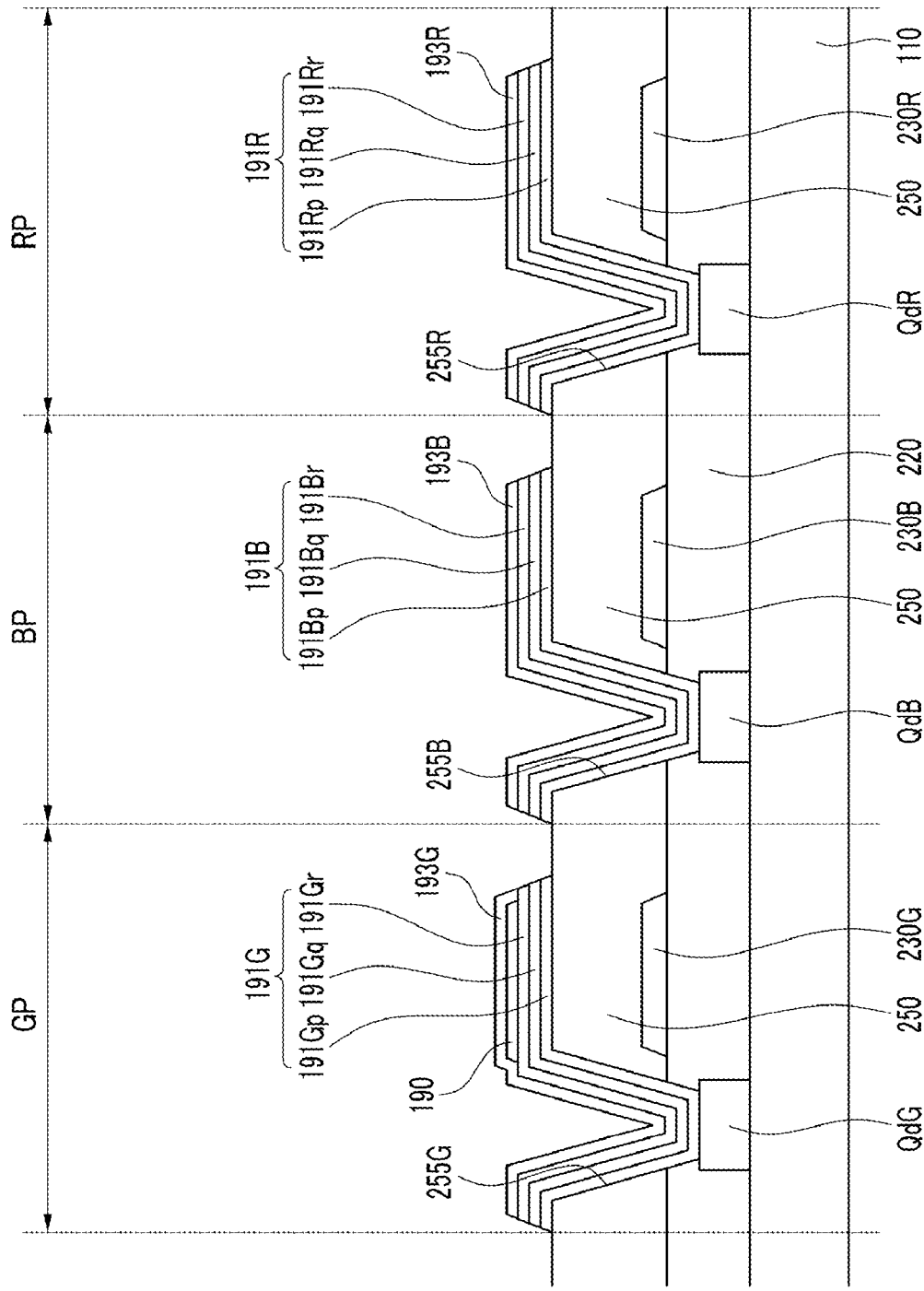

Referring to FIG. 6, the a-IZO films 191p, 191r and 193 and the silver film 191q are wet-etched using the photo-sensitive layer 40 as a mask to form lower films 191Bp, 191Gp and 191Bp, intermediate films 191Rq, 191Gq and 191Bq, upper films 191Rr, 191Gr and 191Br, and auxiliary electrodes 193R, 193G and 193B. The photo-sensitive layer 40 is then removed by a removing solution.

When the intermediate films 191Rq, 191Gq and 191Bq are formed of easily oxidizable metal, such as silver or aluminum, the upper films 191Rr, 191Gr and 191Br may reduce oxidation of the intermediate films 191Rq, 191Gq and 191Bq during the optical path controller 190 formation process. When the intermediate films 191Rq, 191Gq and 191Bq are formed of aluminum alloy or silver alloy, the upper films 191Rr, 191Gr and 191Br may be omitted.

Figure 7:
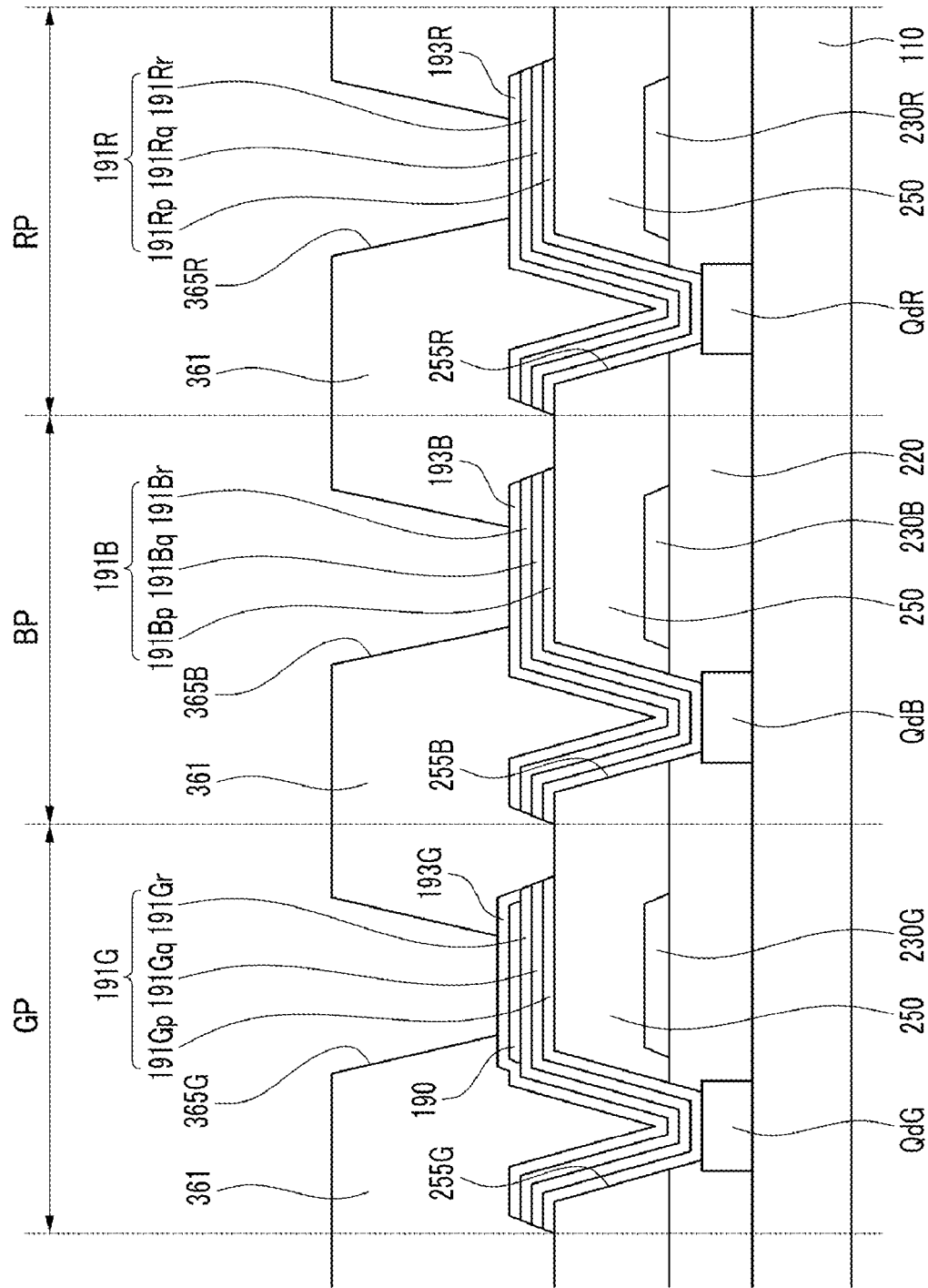

Referring to FIG. 7, an organic layer is deposited and patterned to form a partition wall 361 having openings 365R, 365G and 365B. The openings 365R, 365G and 365B expose a portion of the auxiliary electrodes 193R, 193G and 193B.

Referring to FIG. 2, an organic light emitting member 370 and a common electrode 270 are formed on the partition wall 361 and the auxiliary electrodes 193R, 193G and 193B.

Figure 8:
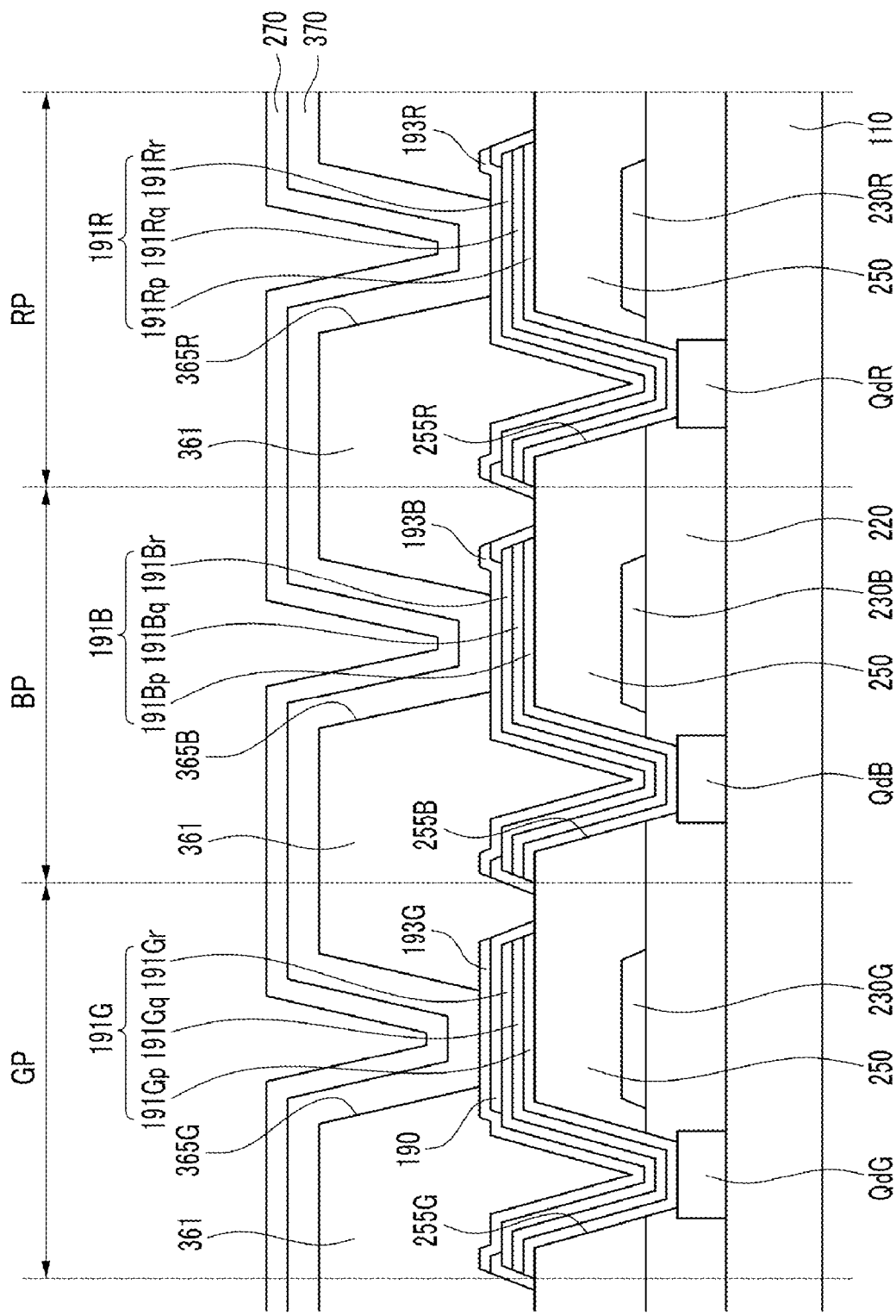
FIG. 8 is a sectional view of an organic light emitting display according to another exemplary embodiment of the present invention.

FIG. 8 is a sectional view of an organic light emitting display according to another exemplary embodiment of the present invention. This embodiment is substantially identical to the embodiment illustrated in FIG. 2 except for the optical path controller 190. Thus any further description except for the optical path controller 190 will be omitted.

The optical path controller 190 of FIG. 2 is disposed in the area only corresponding to the opening 365G of the green pixel GP. However, the optical path controller 190 of FIG. 8 also covers the lateral sides of the pixel electrode 191G, and the layers formed at a same layer as the optical path controller 190 may cover the lateral sides of the pixel electrodes 191R and 191B, thereby reducing the damage to the intermediate films 191Rq, 191Gq and 191Bq that may be caused by the process for patterning the auxiliary electrodes 193R, 193G and 193B. That is, the optical path controller 190 extends to cover a first lateral side of the pixel electrode 191G, and portions of the layer used to form the optical path controller 190 cover a second lateral side of the pixel electrode 191G, as well as lateral sides of the pixel electrodes 191B and 191R.

A method of manufacturing the organic light emitting display shown in FIG. 8 will be described below.

First, a plurality of driving transistors QdR, QdG and QdB, a thin film structure 220 and a plurality of color filters 230R, 230G and 230B are formed on an insulating substrate 110. A planarizing layer 250 of a photosensitive organic material is coated, and the planarizing layer 250 and the thin film structure 220 are patterned to form a plurality of through-holes 255R, 255G and 255B.

Next, an a-ITO film or a-IZO film, a silver film, and another a-ITO film or a-IZO film are deposited and photo-etched to form pixel electrodes 191R, 191G and 191B comprising lower films 191Rp, 191Gp and 191Bp, intermediate films 191Rq, 191Gq and 191Bq, and upper films 191Rr, 191Gr and 191Br. At this time, a wet-etch may be applied.

Next, a silicon oxide film 190'is deposited on the pixel electrodes 191 R, 191G and 191B. The silicon oxide film 190' is then patterned to form an optical path controller 190 that covers lateral sides of the pixel electrodes 191R, 191G and 191B, as well as the portion of the green pixel electrode 191 G that is exposed by the opening 365G. That is, the optical path controller 190 extends to cover a first lateral side of the pixel electrode 191G, and portions of the silicon oxide film 190' cover a second lateral side of the pixel electrode 191G, as well as lateral sides of the pixel electrodes 191B and 191R. At this time, a dry-etch may be applied.

Next, an a-ITO film or a-IZO film is deposited on the optical path controller 190 and patterned to form auxiliary electrodes 193R, 193G and 193B. At this time, a wet-etch may be applied.

Then, a partition wall 361 is formed by photo-etching or photolithography. An organic light emitting member 370 and a common electrode 270 are formed on the partition wall 361

Figure 9:
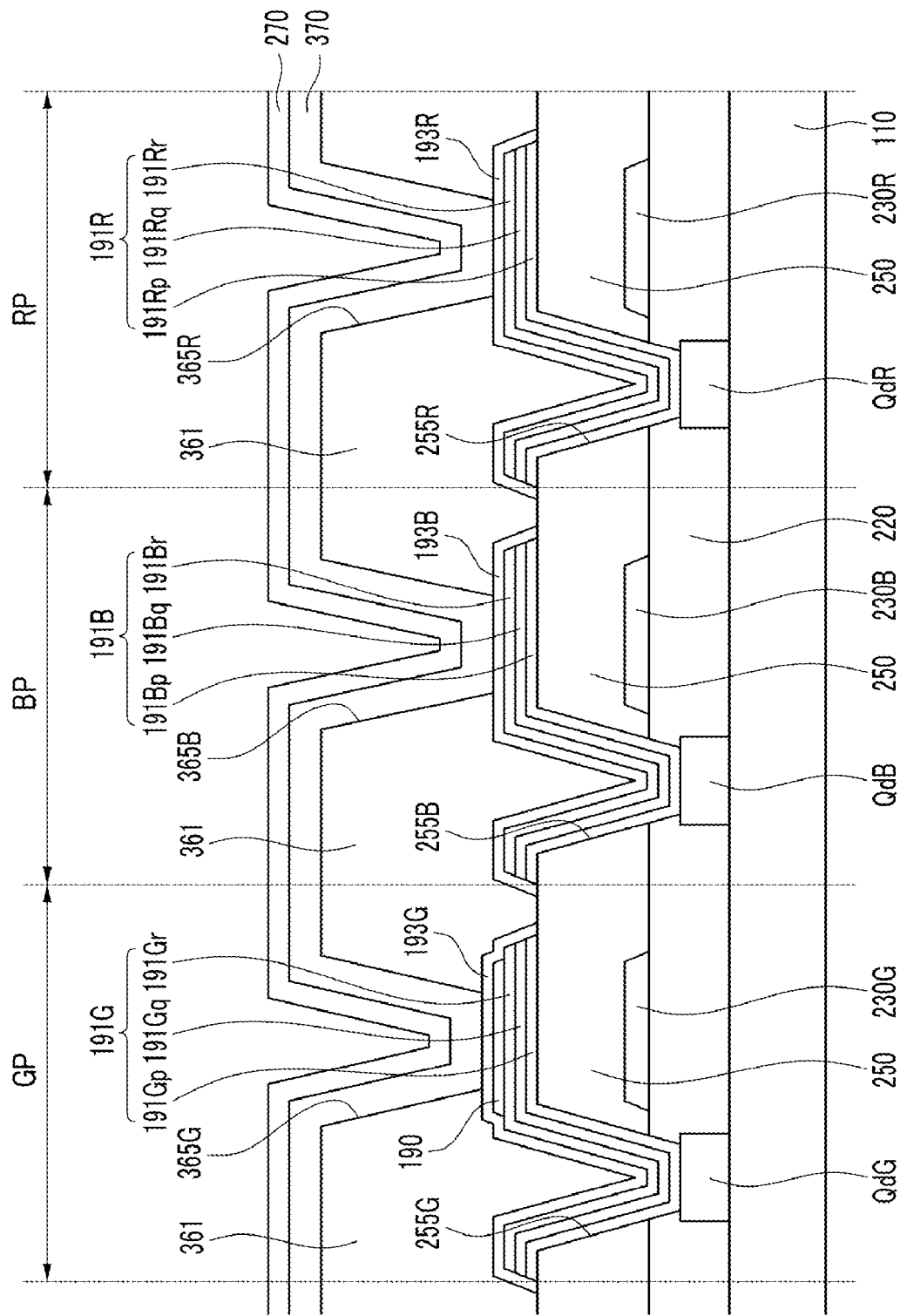
FIG. 9 is a sectional view of an organic light emitting display according to another exemplary embodiment of the present invention.

FIG. 9 is a sectional view of an organic light emitting display according to another exemplary embodiment of the present invention. This embodiment is substantially identical to the embodiment illustrated in FIG. 2 except for the auxiliary electrodes 193R, 193G and 193B. Thus any further description except for the auxiliary electrodes 193R, 193G and 193B will be omitted.

Referring to FIG. 2, the auxiliary electrodes 193R, 193G and 193B have the same shape as the pixel electrodes 191R, 191G and 191B. The edges of the auxiliary electrodes 193R, 193G and 193B coincide with the edges of the pixel electrodes 191R, 191G and 191B. On the other hand, in FIG. 9, the auxiliary electrodes 193R, 193G and 193B cover the sides of the pixel electrodes 191R, 191G and 191B.

A method of manufacturing the organic light emitting display shown in FIG. 9 will be described below.

The processes used until depositing an a-ITO film or a-IZO film 191p, a silver film 191q, another a-ITO film or a-IZO film 191r, and a silicon nitride film 190' and patterning the silicon nitride film 190' to form an optical path controller 190 are substantially the same as the manufacturing method of the exemplary organic light emitting display shown in FIG. 2, which was described with reference to FIG. 3 and FIG. 4.

Next, the a-ITO film or a-IZO film 191p, the silver film 191q, and another a-ITO film or a-IZO film 191r are photo-etched to form pixel electrodes 191R, 191G and 191B comprising lower films 191Rp, 191Gp and 191Bp, intermediate films 191Rq, 191Gq and 191Bq, and upper film 191Rr, 191Gr and 191Br, respectively. At this time, a wet-etch may be applied.

Next, an a-ITO film or a-IZO film is deposited on the optical path controller 190 and patterned to form auxiliary electrodes 193R, 193G and 193B covering lateral sides of the pixel electrodes 191R, 191G and 191B. At this time, a wet-etch may be applied.

Then, a partition wall 361 is formed by photo-etching or photolithography. An organic light emitting member 370 and a common electrode 270 are formed on the partition wall 361

The OLED 10 may comprise additional films such as a protection film (not shown), a moisture absorption film (not shown), or an encapsulation member made of such material as a glass (not shown). In the exemplary embodiments, since bottom emission type OLEDs are described, the color filters 230R, 230G and 230B are formed under the organic light emitting member. However, if a top emission type OLED is applied, color filters may be formed on a common electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display comprising:
   an insulating substrate having a first area, a second area, and a third area;
   a plurality of transistors arranged on the insulating substrate;
   an insulating layer arranged on the transistors;
   a first pixel electrode, a second pixel electrode, and a third pixel electrodes arranged on the insulating layer in the first area, the second area, and the third area, respectively, and connected to the transistors;
   an optical path controller arranged on the first pixel electrode;
   a plurality of auxiliary electrodes arranged on the first pixel electrode, the second electrode, the third pixel electrode and the optical path controller;
   a partition wall having a plurality of openings that expose a portion of the auxiliary electrodes;
   an organic light emitting member arranged on the auxiliary electrodes; and,
   a common electrode arranged on the organic light emitting member,
   wherein the optical path controller covers the lateral side of the first pixel electrode.

2. The organic light emitting display of claim 1, wherein each of the first pixel electrode, the second pixel electrode, and the third pixel electrode comprises a reflective film and a transparent conductive film, and the optical path controller has a lower light absorption coefficient than one or both of the transparent conductive film and the auxiliary electrodes.

3. The organic light emitting display of claim 2, wherein the optical path controller comprises silicon oxide or silicon nitride.

4. The organic light emitting display of claim 3, wherein the third pixel electrode is connected to the auxiliary electrode.

5. The organic light emitting display of claim 4, wherein the optical path controller is disposed on the first pixel electrode and corresponds to the opening.

6. The organic light emitting display of claim 4, wherein the auxiliary electrodes cover the sides of the optical path controller, and the first pixel electrode, the second pixel electrode, and the third pixel electrode.

7. The organic light emitting display of claim 4, wherein the auxiliary electrodes have the same shape as the pixel electrodes.

8. The organic light emitting display of claim 2, wherein the reflective film comprises at least one of silver, silver alloy, aluminum, or aluminum alloy.

9. The organic light emitting display of claim 8, wherein each of the first pixel electrode, the second pixel electrode, and the third pixel electrode further comprises a metal oxide film under the reflective film.

10. The organic light emitting display of claim 9, wherein the transparent conductive film and the metal oxide film comprise indium tin oxide or indium zinc oxide.

11. The organic light emitting display of claim 10, wherein the transparent conductive film, the reflective film and the metal oxide film have substantially the same shape.

12. An organic light emitting display of claim 1, wherein an optical path length is the same between the common electrode and the second pixel electrode and the common electrode and the third pixel electrode.

* * * * *